United States Patent [19]

Seeger et al.

[11] 4,310,787

[45] Jan. 12, 1982

[54] PHASE-CONTROL DEVICE FOR SYNCHRONOUS MOTORS

[75] Inventors: Arnold Seeger; Wilfried Schalt, both of Herzogenrath; Jürgen Räbiger, Duren, all of Fed. Rep. of Germany

[73] Assignee: Kernforschungsanlage Jülich GmbH, Jülich, Fed. Rep. of Germany

[21] Appl. No.: 105,974

[22] Filed: Dec. 21, 1979

[30] Foreign Application Priority Data

Dec. 23, 1978 [DE] Fed. Rep. of Germany ....... 2856012

[51] Int. Cl.³ .............................................. H02P 5/52
[52] U.S. Cl. ......................................... 318/85; 318/78; 318/606; 318/608; 318/314; 318/721; 318/723; 307/262
[58] Field of Search .................... 318/41–44, 318/85, 77, 78, 606, 608, 314, 721, 723, 799, 809, 810, 254; 455/112; 375/23; 332/16 R; 307/262

[56] References Cited

U.S. PATENT DOCUMENTS

| | | | |
|---|---|---|---|
| 2,768,290 | 10/1956 | Harris et al. | 318/608 |
| 3,600,655 | 8/1971 | Karlin et al. | 318/85 |
| 4,079,297 | 3/1978 | Norell | 318/85 |
| 4,099,103 | 7/1978 | Seeger et al. | 318/85 |

FOREIGN PATENT DOCUMENTS 1537160 9/1969 Fed. Rep. of Germany .
2755796 7/1978 Fed. Rep. of Germany .

Primary Examiner—J. V. Truhe
Assistant Examiner—Eugene S. Indyk
Attorney, Agent, or Firm—Karl F. Ross

[57] ABSTRACT

A device for controlling the phase of an output pulse sequence relative to an input pulse train of the same frequency comprises a multiplier receiving the pulse train from a frequency generator and emitting to a divider a rectangular waveform having a frequency m times that of the pulse train. The divider is controlled by a comparator to divide the frequency of the rectangular waveform by a factor of $m+1$, $m-1$, or m, depending on whether the actual phase difference between the pulse train and the sequence is less than, greater than, or equal to a predetermined phase angle, the actual phase difference being communicated to the comparator by a counter registering during each cycle of the pulse train a number of pulses proportional to the phase difference. The divider may energize via a frequency converter a synchronous motor having a rotor connected to a disk whose rate of rotation is monitored by a pickup transmitting a pulse sequence to the counter for phase comparison with the input pulse train, whereby the position of the rotor and the disk upon each rotation may be precisely controlled. The angular position of the rotor and disk may be controlled relative to a second rotor of another synchronous motor, this motor being energized either directly by the frequency generator or indirectly via another multiplier, divider, comparator and counter.

10 Claims, 5 Drawing Figures

PHASE-CONTROL DEVICE FOR SYNCHRONOUS MOTORS

FIELD OF THE INVENTION

Our present invention relates to a device for controlling the phase position of a waveform and, more particularly, for controlling the angular position of the rotor of a synchronous motor with respect to a reference signal or with respect to the angular position of the rotor of another synchronous motor, especially for use in a chopper or the like in neutron spectrometry.

BACKGROUND OF THE INVENTION

Neutron spectrometry can involve the generation of a polychromatic beam of neutrons which are characterized by different velocities and hence energies, these velocities and energies being associated with respective frequencies.

Generally a monoenergetic beam of neutrons is desired for use, for instance, in the investigation of solid matter by neutron scattering or for activation of a substance or for investigation of the dynamic behavior of atoms.

It is thus a common practice to subject the polychromatic beams to a form of filtration or monochromatization, selecting the neutrons of a single energy velocity or frequency from the polychromatic beam. Such monochromatization or energy-separation of the polychromatic beam of neutrons is generally carried out by drum separators and disk choppers, as described in commonly owned U.S. Pat. No. 4,099,102 issued July 4, 1978.

In time-of-flight neutron spectrometers it is important to control the rotation angle of the rotor of a synchronous motor relative to the input frequency of the frequency generator energizing the motor (i.e. the degree to which the rotor may be lagging the position determined by the applied frequency) or to control relative angular positions of the rotors of several synchronous motors.

In a known system for controlling the angular position of a rotor, a pulse train is fed to a cascade of dividers, the effective length of the chain being temporarily modified for implementing an incremental change in the rotor's position. The disadvantage of that system is that a pulse of immoderately high frequency must be generated. If a lower frequency is used, the minimal incremental change in rotor angle correspondingly increases.

In another known system, the original pulse train is converted by an integrator into a sawtooth signal fed to a threshold detector whose output signal is a rectangular wave shifted in phase with respect to the original pulse train, the magnitude of the shift depending on a preset triggering level. A major disadvantage of this method is the limitation of phase shifts to 20° in the control of the rotor position of three-phase six-pole synchronous machines.

Reference may also be had to German Patent Document (open application—Offenlegungsschrift) 27 55 796 and 15 37 160 and the documents or references of record in U.S. Pat. No. 4,099,103.

OBJECTS OF THE INVENTION

An object of our present invention is to provide a device for precisely controlling the phase of an output pulse sequence relative to a reference pulse train of the same frequency.

A more particular object of our present invention is to provide such a device capable of adjusting the phase of an output sequence in fine increments throughout a 360° cycle and, furthermore, to provide for the adjustment of a preselected phase displacement permanently independent of any frequency variation.

A further object of our present invention is to provide such a device for controlling the angular position of a rotor of a synchronous motor according to the reference pulse train or relative to the angular positions of one or more rotors of other synchronous machines.

SUMMARY OF THE INVENTION

A device for controlling phase shift comprises, according to our invention, in principle a device for effecting a dephasage of an incoming pulse train by initially multiplying its frequency by a factor m but decreased or increased by an increment, which process results in an advancement or lagging of the phase position. More specifically, the phase-shifting device comprises a generator for emitting a pulse train and a frequency multiplier having a predetermined product modulus. The multiplier is connected to the generator for increasing the frequency of the pulse train by a factor equal to the product modulus m. The increased frequency is fed to a frequency divider having a quotient modulus generally equal to the product modulus of the multiplier. A phase comparator receiving the input and the output frequency temporarily changes the magnitude of the quotient modulus to produce a predetermined phase difference between the pulse train and the pulse sequence or frequency at the output of the divider.

According to another feature of our present invention, the phase comparator has an input connection extending from a counter having a start-counting input receiving an O-phase signal from the generator, a count-stopping input receiving an O-phase signal from the output, and an incrementing input receiving a stepping signal. In the interval between starting and stopping pulses, the counter registers a number of stepping pulses proportional to the phase difference between the pulse train and the output sequence; preferably, the incrementing input of the counter is connected to the output of the multiplier, whereby the phase reading is independent of frequency.

According to another feature of our present invention, the comparator has, in addition to the connection carrying from the counter a signal indicating the actual phase difference between the pulse train and the output sequence, a second input receiving a signal coding a predetermined phase angle. The comparator works into the divider for incrementally modifying the quotient modulus to effect a shift in phase of the output sequence upon detecting an inequality between the actual phase difference detected by the counter and the desired phase difference present on the second input of the comparator.

According to yet another feature of our present invention, the second O-phase signal is produced by a synchronous motor having a rotor and energized by an output waveform of the divider. A pickup responsive to the O-phase position of the rotor is connected to the count-stopping input of the counter, whereby the angular position of the rotor is controlled relative to the rotating field of the motor.

According to a more particular feature of our present invention, the frequency generator energizes an additional synchronous motor. An additional pickup responsive to the rotation of the rotor of the additional synchronous motor is connected to the multiplier and to the count-starting input of the counter, whereby the angular position of the rotor of the first synchronous motor is controlled relative to the angular position of the rotor of the additional synchronous motor.

Alternatively, the rotor of the first motor may be controlled relative to the rotor of a third synchronous machine energized by a second divider in turn fed the output pulse train of the frequency generator via a second multiplier. The second multiplier and divider have their own product and quotient moduli, respectively, the quotient modulus generally being equal to the product modulus. The pulse train from the frequency generator is also carried to the count-starting input of a second counter having a count-stopping input fed by a third pickup generating a pulse for every rotation of the rotor of the third synchronous machine. A second comparator receives from the second counter a signal indicating the substantially instantaneous phase difference between the pulse train from the frequency generator and an output pulse sequence of the third pickup. The second comparator is connected to the second divider for temporarily changing the quotient modulus thereof by an incremental amount in response to a discrepancy between the phase-difference signal from the second counter and a signal coding a second predetermined phase angle. Thus, the angular positions of the rotors of the first and third synchronous machines are controlled relative to one another.

According to a variation of our invention, the output of the dividers may be connected directly to the inputs of the respective counters, whereby the phases of the output sequences of the dividers may be shifted to predetermined positions relative to the pulse train from the frequency generator.

Advantageously, the multipliers comprises respective phase-locked-loop circuits.

The phase shifter according to the invention thus permits a phase shift of practically any angle over 360° to be obtained with practically no limitations within technologically interesting ranges and with low cost. The system of the invention thus comprises a multiplier element (circuit) A which multiplies the input frequency by a factor m, the output being subjected to division in a divider B by essentially the same factor which can be briefly increased or decreased by a unit to effect phase shift of the output to lead or lag the input signal.

The resulting circuit uses conventional circuit elements to achieve a quasi-stepless shift over phase angles as much as 360° in increments of say 0.01° to synchronize motors with a speed range of 100 rpm to 12,000 rpm. There is no effective limitation of the speed range over which the system is effective.

BRIEF DESCRIPTION OF THE DRAWING

These and other features of our present invention will now be described in detail, reference being made to the accompanying drawing in which.

SPECIFIC DESCRIPTION

Figure 1:
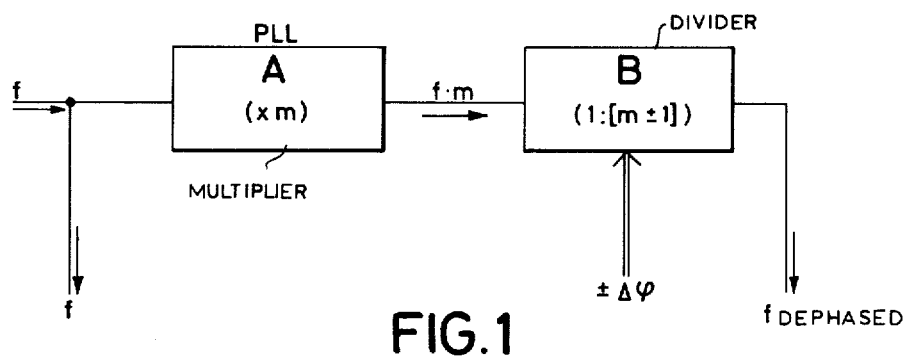
FIG. 1 is a block diagram showing essential components of a device according to our invention for producing an output pulse sequence having a phase difference with respect to the input pulse train which has the same frequency as the sequence.

As illustrated in FIG. 1, a device for producing a dephased pulse sequence, i.e. an output sequence "dephased" having the same frequency as a pulse train f and differing in phase therefrom by a predetermined angle $\phi$, comprises a frequency multiplier A having a product modulus m and a frequency divider B having a quotient modulus q generally equal to modulus m. Multiplier A receives pulse train f and emits to divider B a pulse signal f·m having a frequency exceeding that of train f by a factor equal to modulus m. Quotient modulus q is incremented to m+1 or decremented to m−1 according to an input signal $\Delta\phi$, whereby output sequence "f dephased" is phase-shifted backwards or forwards with respect to pulse train f.

Figure 2:
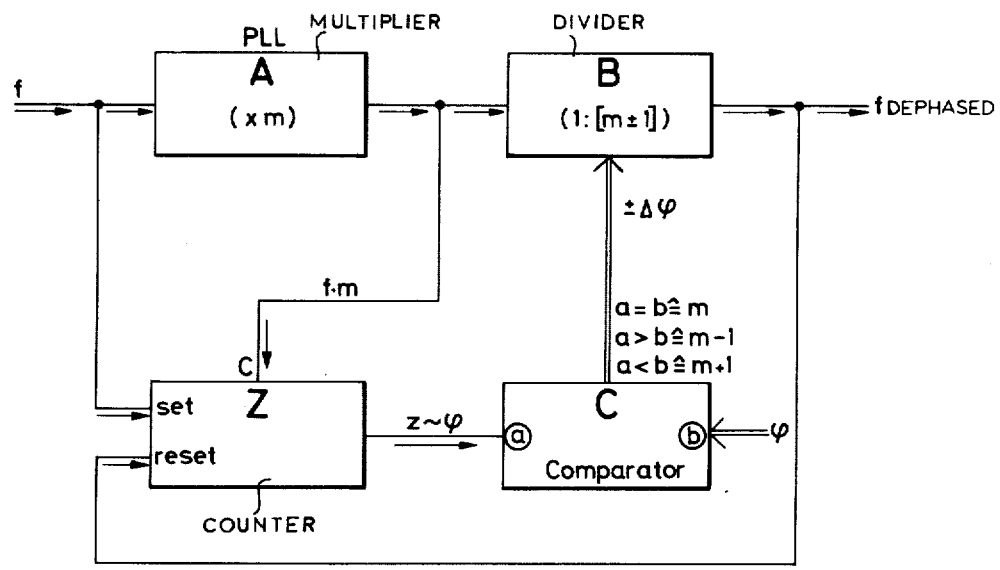
FIG. 2 is a block diagram similar to FIG. 1, also showing a phase comparator for controlling a divider shown in FIG. 1.

As shown in FIG. 2, signal $\Delta\phi$ may be automatically generated by a comparator C for ensuring that the dephased output sequence differs from input train f by phase angle $\phi$, this angle being coded by a similarly designated signal fed to an input b of comparator C. Unit C also receives on an input a extending from a counter Z a single $z \sim \phi$ indicating the actual phase difference between the output sequence and train f. Counter Z has a set or count-starting input receiving train f, a reset of count-stopping input receiving the dephased sequence and a countable-pulse or incrementing input-receiving pulse signal f·m. During each interval between a pulse train f and a subsequent pulse from divider B, counter Z registers the number of pulses emitted by multiplier A, such number being proportional to the instantaneous phase difference between input train f and the output sequence f, and emits signal $z \sim \phi$ to comparator C.

If the predetermined phase angle $\phi$ represented by the signal at comparator input b is less than the actual phase angle between train f and sequence "f dephased", represented by the signal $z \sim \phi$ at input a, comparator C emits to divider B a signal incrementally changing modulus q to a magnitude m−1; if the signal at input b indicates a greater angle than the signal at input a; comparator increments modulus q to a value m+1. The modification of modulus q continues until the output sequence has phase angle $\phi$ with respect to train f, in which event quotient modulus q assumes or reassumes the same value as product modulus m. It is to be noted that the phase of the output sequence is shifted by an identical amount 360°/m for each cycle of train f during which quotient modulus q is modified under the control of comparator C.

Figure 3:
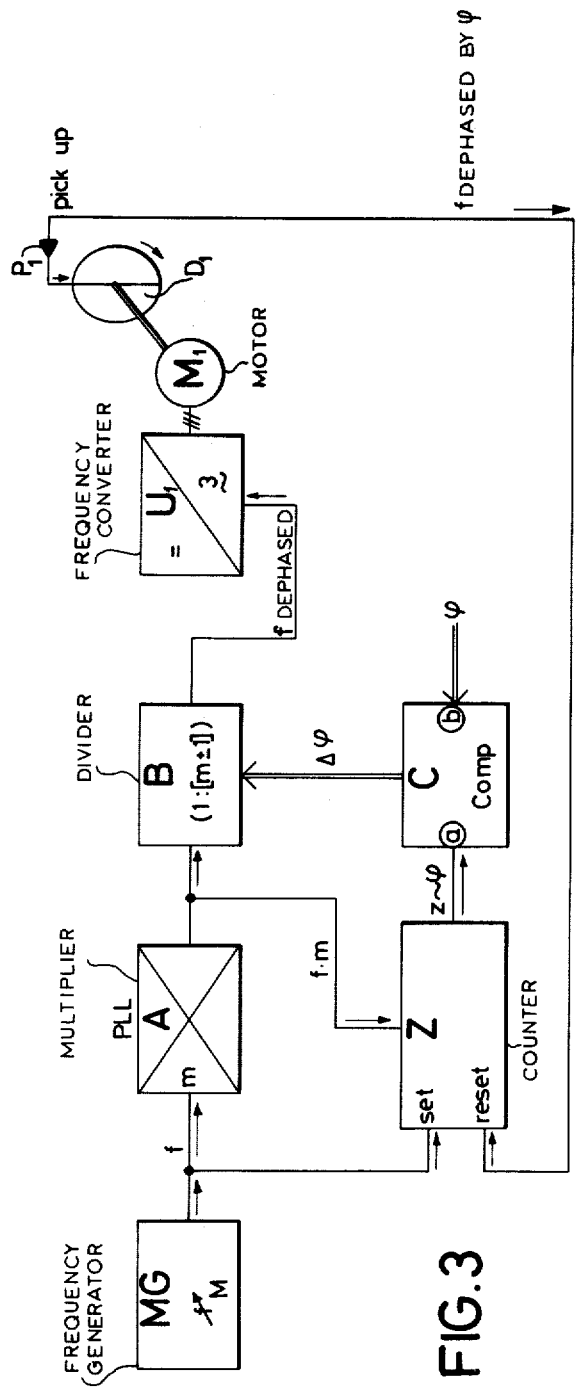
FIG. 3 is a partial block diagram similar to FIG. 2, further illustrating a synchronous motor energized by an output pulse sequence of the device of FIG. 2.

As illustrated in FIG. 3, train f may be emitted by a frequency generator MG tied to multiplier A and to the count-starting input of counter Z. The output sequence of divider B is fed to a frequency converter $U_1$ energizing a synchronous motor $M_1$ which has a rotor connected to a disk $D_1$ whose rate of rotation is monitored by a pickup $P_1$. This pickup advantageously comprises a photoelectric device emitting a pulse for every rotation of disk $D_1$. The resulting pulse sequence, differing in phase from train f by angle $\phi$, is transmitted to the count-stopping input of counter Z which then applies to input a of comparator C signal $z \sim \phi$ indicating the phase difference between train f and the pickup output sequence, as heretofore described with respect to FIG. 2. Comparator C generates binary signals $\Delta \phi$ for incrementing or decrementing quotient modulus q, depending on whether the detected phase difference between train f and the output sequence of pickup $P_1$ is less or greater than predetermined angle $\phi$. Thus, the device illustrated in FIG. 3 serves to control the angular position of disk $D_1$ independently of the angular velocity of synchronous motor $M_1$. During operation of machine $U_1$, $M_1$ by device A,B,C,Z, MG, the pickup output sequence will generally have the same frequency as train f. Because the time that disk $D_1$ rotates at the frequency of train f is generally much greater (except perhaps during an initialization or start-up phase) than the time required to readjust the phase of the output sequence, the same can be said to basically have the same frequency as train f.

Figure 4:
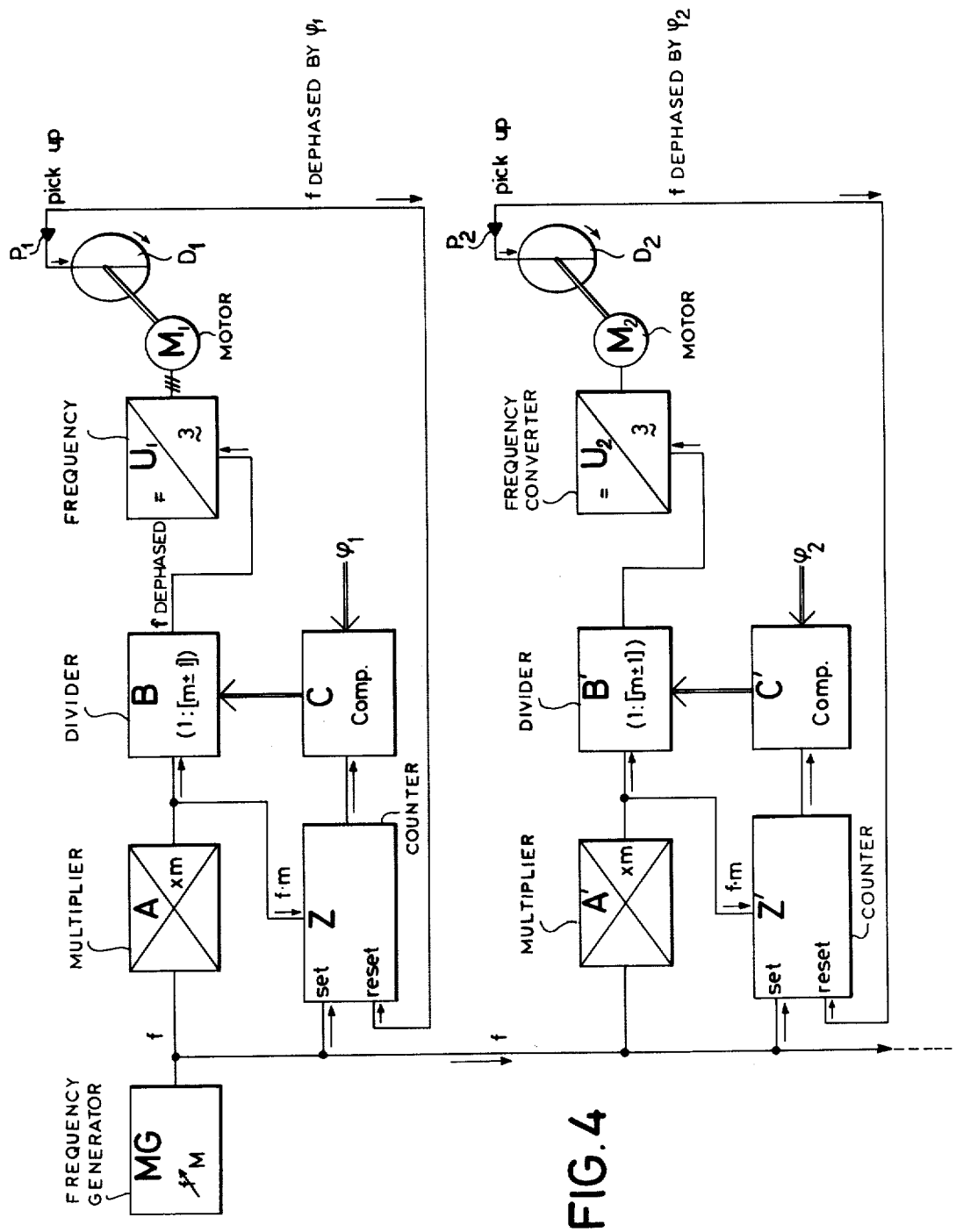
FIGS. 4 and 5 are partial block diagrams showing devices according to our present invention for controlling the angular positions of two synchronous-motor rotors relative to one another.

As shown in FIG. 4, frequency generator MG may be coupled to an additional multiplier A' having the same product modulus m as multiplier A and to the count-starting input of a second counter Z'. Multiplier A' feeds output signal f·m to a stepping input of counter Z' and to an additional divider B' having a quotient modulus q' generally equal to modulus m. Modulus q' is temporarily changed an incremental amount under the control of another comparator C' responsive to an actual-phase-difference signal emitted by counter Z' and to a signal $\phi_2$ coding a similarly designated phase angle. Divider B' has an output lead extending to a frequency converter $U_2$ energizing a synchronous motor $M_2$ which has a rotor rigid with a disk $D_2$. A second pickup $P_2$ is connected to the count-stopping input of counter Z' for transmitting thereto a pulse upon every rotation of disk $D_2$. This disk is maintainable by the device shown in FIG. 4 in a fixed angular position relative to disk $D_1$. The angular positions of further disks may be controlled in the same manner. Although multipliers A and A' preferably have the same modulus m, this is, of course, not strictly necessary. In case of equal motor speed in both systems, as assumed for FIG. 4, the second multiplier A' could be omitted and the divider B', as well as the counter Z' could be fed by the first multiplier A.

Figure 5:
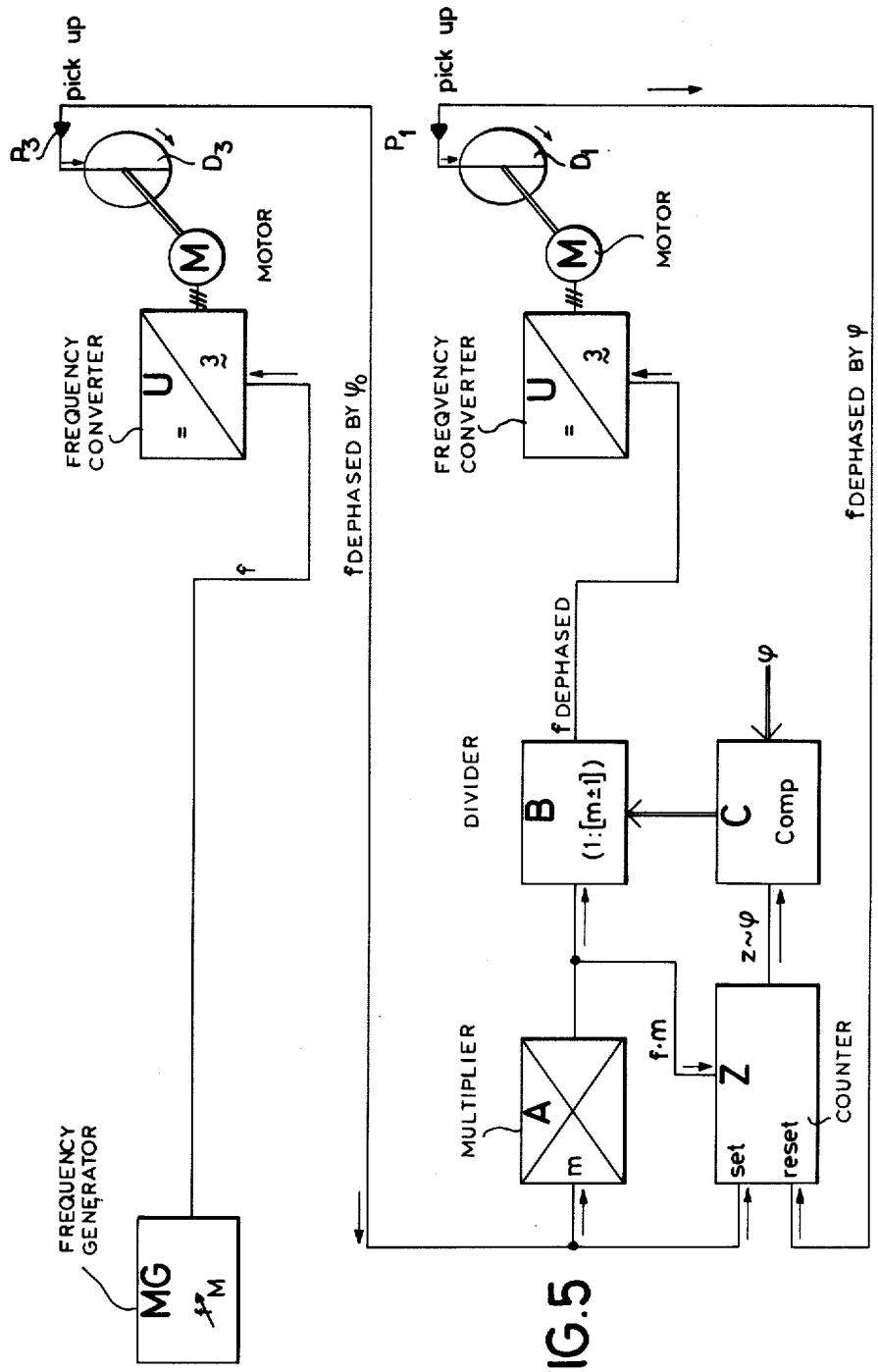

Another arrangement for controlling the angular position of one rotating disk $D_1$ relative to another $D_3$ is shown in FIG. 5. Frequency generator MG is tied to a frequency converter $U_3$ forming a part of a synchronous machine further including motor $M_3$. This motor has a rotor turning a disk $D_3$, every rotation of which induces a pickup $P_3$ to emit a pulse to multiplier A and to the count-starting input of counter Z. A pulse train thus transmitted to multiplier A is converted thereby into a train f·m whose frequency is m times that of train f. As heretofore described with reference to FIG. 3, the output sequence of pickup $P_1$ is controlled by comparator C and divider B relative to input train from pickup $P_3$.

It is therefore assumed that comparator C increments or decrements quotient modulus q, i.e. changes the magnitude of modulus q by one unit. Although the resultant shift of 360°/m in the phase of output sequence for a cycle of train f is preferable, it is also possible to implement a cyclical phase shift with a magnitude increased by an integral factor n.

We claim:
1. A device for controlling phase shift of a pulse train having a given frequency by a phase angle $\phi$ remaining constant even when the frequency is changing, comprising:
   a fixed-value frequency multiplier having a predetermined product modulus, said multiplier being fed by the pulse train for increasing the frequency thereof by a factor equal to said modulus;
   a frequency divider having a quotient modulus generally equal to said product modulus and being fed by the output of the frequency multiplier; and
   means for modifying the quotient modulus cycle by cycle with respect to the product modulus by an increment, the phase shift being effected by shortening or lengthening the quotient by said increment, whereby an advancement or lagging of the phase position of an output signal of said divider is attained in relation to the predetermined frequency.

2. A device for controlling phase shift, comprising:
   generator means for emitting a pulse train;
   a fixed-value frequency multiplier having a predetermined product modulus, said multiplier being connected to said generator means for increasing the frequency of said train by a factor equal to said modulus;
   modifying means connected to said multiplier for emitting a pulse sequence basically having the same frequency as said train, said modifying means including a frequency divider having a quotient modulus generally equal to said product modulus; and
   phase comparator means connected to said generator means and to said modifying means for temporarily changing the magnitude of said quotient modulus to produce a predetermined phase difference between said train and said sequence.

3. The device defined in claim 2 wherein said comparator means includes a counter having a count-starting input connected to said generator means for receiving said train, a count-stopping input connected to said modifying means for receiving said sequence, and an incrementing input receiving a stepping-pulse signal, whereby the pulse difference between said train and said sequence is substantially instantaneously measured by the number of pulses registered by said counter in the interval between starting and stopping of the counter.

4. The device defined in claim 3 wherein said incrementing input is connected to an output of said multiplier.

5. The device defined in claim 2 wherein said phase comparator means includes a comparator having a first input connected to said counter for receiving a signal indicating the actual phase difference between said train and said sequence, and a second input for receiving a signal coding a predetermined phase angle, said comparator being connected to said divider for incrementally modifying said quotient modulus to effect a shift in the phase of said sequence upon detecting an inequality between said actual phase difference and said angle.

6. The device defined in claim 5 wherein said modifying means further includes a synchronous motor having a rotor and energized by an output waveform of said divider, and a pickup responsive to the rotation of the rotor, said pickup being connected to the count-stopping input of said counter, whereby said device controls the angular position of said rotor relative to the rotating field of said motor.

7. The device defined in claim 6 wherein said generator means includes a frequency converter energizing a synchronous motor having an additional rotor, said generator means further including an additional pickup responsive to the rotation of said additional rotor and connected to said multiplier and to the count-starting input of said counter, whereby the angular position of the rotor of a second generator means fed by said modifying means is controlled relative to the angular position of the rotor of the first generator means.

8. The device defined in claim 6, further comprising a second multiplier receiving said train from said generator means; a second frequency divider having an input linked to said second frequency multiplier; a second synchronous motor with a second rotor and a second pickup generating a second pulse sequence in response to the rotation of said second rotor; a second counter having a count-starting input receiving said train, a count-stopping input connected to said second pickup, and an incrementing input connected to an output of said second frequency multiplier; and a second comparator having one input receiving from said second counter a signal indicating the actual phase difference between said train and said second pulse sequence, and another input receiving a signal coding a second predetermined phase angle; wherein said second frequency multiplier has a second product modulus and increases the frequency of said train by a factor equal to said second product modulus, said second frequency divider has a second quotient modulus generally equal to said second product modulus and produces an output waveform generally having the same frequency as said train, and said second comparator has an output extending to said second frequency divider for temporarily changing said second quotient modulus by an incremental amount to effect a phase shift of said second pulse sequence upon detecting an inequality between the signal received from said second counter and said second predetermined phase angle.

9. The device defined in claim 5 wherein the count-stopping input of said counter is connected directly to an output of said divider carrying said sequence.

10. The device defined in claim 2, 3, 4, 5, 6, 7, 8 or 9 wherein said multiplier is of the phase-locked-loop type.

* * * * *